(12) United States Patent
Gac et al.

(10) Patent No.: US 10,147,670 B2
(45) Date of Patent: Dec. 4, 2018

(54) DUAL MODULE FOR DUAL CHIP CARD

(71) Applicant: OBERTHUR TECHNOLOGIES, Colombes (FR)

(72) Inventors: Philippe Gac, Colombes (FR); Mickael Huet, Colombes (FR); Jean-Michel Fontaine, Colombes (FR)

(73) Assignee: IDEMIA FRANCE, Colombes (FR)

( * ) Notice: Subject to any disclaimer, the term of this patent is extended or adjusted under 35 U.S.C. 154(b) by 0 days.

(21) Appl. No.: 15/562,239

(22) PCT Filed: Apr. 1, 2016

(86) PCT No.: PCT/FR2016/050744
§ 371 (c)(1),
(2) Date: Nov. 9, 2017

(87) PCT Pub. No.: WO2016/156755
PCT Pub. Date: Oct. 6, 2016

(65) Prior Publication Data
US 2018/0108595 A1    Apr. 19, 2018

(30) Foreign Application Priority Data
Apr. 2, 2015    (FR) ................................. 15 52865

(51) Int. Cl.
*G06K 19/00* (2006.01)
*H01L 23/48* (2006.01)
*G06K 19/077* (2006.01)

(52) U.S. Cl.
CPC ........ *H01L 23/48* (2013.01); *G06K 19/07739* (2013.01); *G06K 19/07747* (2013.01);
(Continued)

(58) Field of Classification Search
CPC ....... G06K 19/07739; G06K 19/07747; G06K 19/07754; G06K 19/0775; H01L 2224/45144; H01L 2224/49171
See application file for complete search history.

(56) References Cited

U.S. PATENT DOCUMENTS 6,313,524 B1 * 11/2001 Pueschner ........ G06K 19/07743
257/666
7,183,636 B1 *  2/2007 Boccia ................. G06K 19/077
257/678
(Continued)

FOREIGN PATENT DOCUMENTS

FR    2 769 390 A1    4/1999
FR    2 861 201 A1    4/2005

OTHER PUBLICATIONS

International Search Report, dated Sep. 7, 2016, from corresponding PCT application No. PCT/FR2016/050744.

*Primary Examiner* — Daniel Hess
(74) *Attorney, Agent, or Firm* — Young & Thompson

(57) ABSTRACT

A dual module for a dual chip card includes a supporting film supporting on an outer surface, a plurality of connecting pads including two series of connecting pads extending in a given direction and, on an inner surface, two inner connection areas for connection to an antenna of the dual card and a chip, the chip including contact terminals connected by wires to the inner connection areas or electric connecting pads by holes passing through the supporting film while being coated, together with the wires, by coating resin. The electric connecting pads of the outer surface include only three pads. Each of the two inner connection areas forms a comb including a body extending under each of the pads of one of the two series of connecting pads separated from the
(Continued)

Figure 1:
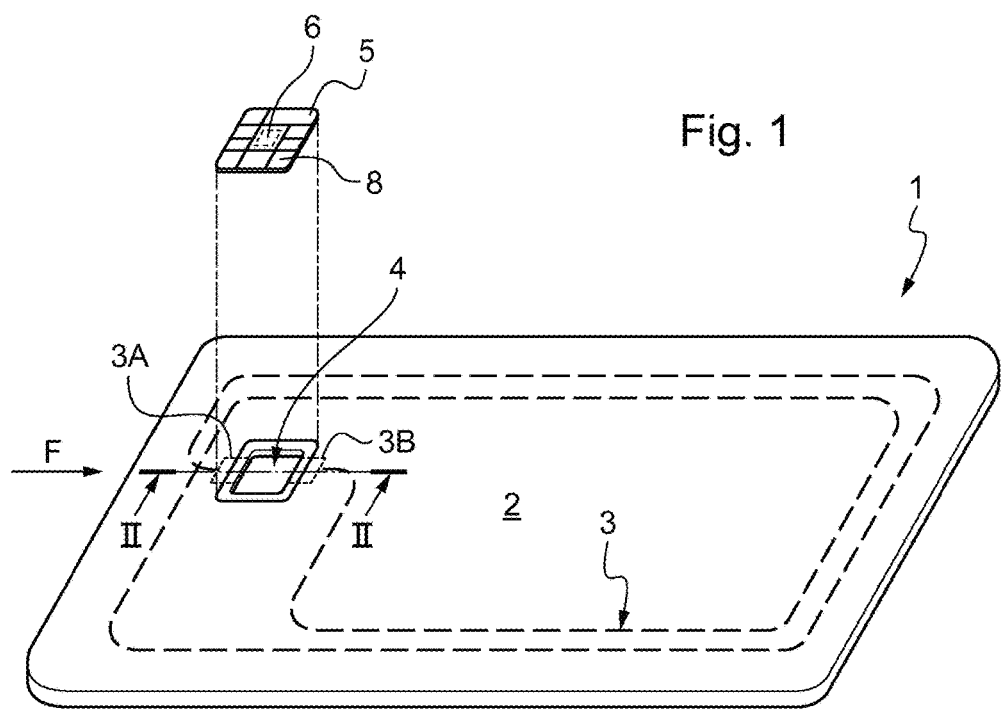

coating mass, respectively. Blades extend separately from one another from the body until ends covered by the coating mass.

20 Claims, 3 Drawing Sheets

(52) U.S. Cl.
CPC ... *G06K 19/07754* (2013.01); *G06K 19/0775* (2013.01); *H01L 2224/45144* (2013.01); *H01L 2224/49171* (2013.01)

(56) References Cited

U.S. PATENT DOCUMENTS

| | | | |
|---|---|---|---|
| 7,663,564 B2 | 2/2010 | Ayala et al. | |
| 7,735,741 B2 | 6/2010 | Launay et al. | |
| 8,430,322 B2* | 4/2013 | Dhers | G06K 19/02 235/487 |
| 2005/0252978 A1* | 11/2005 | Nishizawa | G06K 19/072 235/492 |
| 2016/0004948 A1* | 1/2016 | Goetz | G06K 19/02 156/196 |
| 2017/0270398 A1* | 9/2017 | Mathieu | G06K 19/07733 |

\* cited by examiner

DUAL MODULE FOR DUAL CHIP CARD

The invention concerns the miniaturization of microcircuit modules comprising dual type chip cards, that is, chip cards able to communicate with the outside both by a physical interface using contact pads and with a non-contact interface using an antenna.

Since the format of credit cards, or identity cards, various smaller formats have been defined, and standardized, in order to meet different types of needs. The format of the credit cards having been designated as ID-1 or 1FF, the format ID-000 or 2FF has been defined, to apply to telephone service identification cards (SIM cards), followed by the format 3FF, also known as mini-SIM. More recently, the format 4FF or nano-SIM has been defined.

Such cards comprise a body with a cavity which contains a microcircuit module formed by a supporting film containing, on a surface designated as outer surface, a group of contact pads designed to make contact with the contact pads of a communication terminal by contact and, on the other surface designated as inner surface, a microcircuit whose terminals are connected to the contact pads across the supporting film. The fixation of the module to the body may be done both between the supporting film and the edge of the cavity and/or between a resin mass coating the microcircuit and the bottom of the cavity.

It will be understood that, in order to meet the conditions set by the standards applicable to the chip cards, especially the standards ISO-14443 and ISO-7816, the modules must meet a certain number of conditions, especially as regards the dimensions and the arrangement of the contact pads.

The antenna of a dual type chip card is usually formed in the body containing the module, having its ends situated in proximity to the cavity containing this module this antenna is tuned to the same frequency as the terminals with which it is designed to be able to communicate, in practice to 13.56 MHz in order to be integrated in a dual type chip card, a module thus needs to be configured so that it can connect its microcircuit to the ends of the antenna this connection is usually realized by means of internal contact pads, that is, by means of pads situated on the inner surface of the supporting film, next to the surface supporting the contact pads designed to be brought into contact with a communication terminal by contact; such a module is also known as a dual type module.

As long as the dimensions of the cards were substantially greater than the dimensions of the modules, the same module format could be used, sometimes called M4 format, having a length of 13 mm and a width of 11.8 mm (the dimensions of the 1FF format are 85.60 mm×53.98 mm, those of the 2FF format are 25 mm×15 mm, and those of the 3FF format are 15 mm×12 mm). For the largest cards, a larger module format has been defined, known as M5. In order to reduce the costs of production, it has been found to be desirable to have a module of smaller format; thus, a format M3 has been proposed, whose dimensions are on the order of 11+/−0.2 mm×82+/−0.2 mm (for example, 10.85 mm*8.17 mm; this format has not been completely stabilized).

The lifetime of a chip card depends in significant manner on the ability of its module to withstand the various mechanical or thermal stresses which a user may subject it to, if only to insert it or remove it from its card holder; moreover, the often confidential nature of the data contained in the microcircuit requires the microcircuit not to be able to be removed from the card which contains it without being destroyed. This has resulted in the specification of a large number of tests (especially torsion tests) which a module must be able to withstand without degradation, or on the contrary which it must not be able to undergo without irreversible destruction of the microcircuit. In other words, a module should be flexible in certain zones, and as rigid as possible in other zones.

The outer surface of a module, that is, the surface containing the contact pads, is in practice almost entirely metallized so that each of the contact pads has a sufficient surface to meet the applicable standards for the cards; on the other hand, this surface cannot be entirely metallized, since the various contact pads need to be sufficiently insulated electrically from each other in order to enable a sufficient utilization of each of them.

These contact pads are electrically conductive, typically formed of copper.

The connection of the microcircuit to the outer contact pads or the connection pads to the antenna may be realized by means of connection wires, typically gold wires. According to another option, the inner surface of the supporting film has a printed circuit comprising zones to which the terminals of the microcircuit are connected directly; however, it will be understood that the method of connection by wire provides a greater flexibility, since it is able to adapt to several microcircuit geometries (which is not the case with the method of connection by printed circuit which depends on the geometry of the microcircuit terminals).

The subject matter of the invention is a module of dual type, thus comprising contact pads on an outer surface and connection pads to an antenna on an inner surface, of small format, yet meeting the conditions of mechanical performance applying in particular to the format M4, especially those involving flexion/torsion, yet without reducing the dimensional tolerances in card inserting operations, while entailing a reduced cost, especially because the supporting film is adapted to being associated with a great variety of microcircuit geometries.

It should be noted that the need to have small modules is not necessarily due to the size of the card in which such modules are going to be installed; thus, it may be of interest to install small modules in cards of format larger than 2FF, including the format ID-1, when it is desired to install large antennas, or especially when various security steps need to be applied to the surface of the card body (for example, the inalterable embedding of a mark or photo).

For this purpose, the invention proposes a dual module for a dual chip card, comprising a supporting film supporting on an outer surface a plurality of electrical contact pads (C1-C8) including two series of electrical contact pads extending in a given direction for their entire length along two edges of this supporting film which are parallel to this direction and, on an inner surface, two internal connection zones designed to be connected to an antenna of said dual chip card and a microcircuit, this microcircuit having connection terminals connected by wires respectively to the internal connection zones or to certain of the electrical contact pads by means of holes passing through this supporting film while being coated, together with these wires, by a coating resin mass, characterized in that the series of electrical contact pads of the outer surface have only three pads (C1-C3, C5-C7) and in that each of the two internal connection zones is shaped as a comb comprising a body extending under each of the pads of one of the two series of contact pads separated from the coating mass, and teeth, including two end teeth starting at the ends of the body and, preferably, at least one intermediate tooth, which extend independently of one another from said body, transversely to the given direction, as far as the ends covered by the coating mass, one of the ends of one tooth of each comb being connected by one of said wires to one of said connection terminals of the microcircuit.

It will be appreciated that such a module is able to combine a substantial mass of coating resin with great freedom in the choice of the zones of the inner surface where the connection wires end up (depending on the particular geometry of the microcircuit chosen to be part of the module, without complicating the modes of inserting such a module in the card body of a dual card, despite the need to connect the internal connection zones to the ends of the antenna of this body.

Advantageously, the teeth of the combs extend from their body on either side of the holes, the outermost teeth of each comb, which are the ones furthest apart from each other, being longer than the other teeth of the same comb, so that their ends are next to a zone of the outer surface which is situated between said series of electrical contact pads. Thus, the ends of the group of teeth form a polygonal zone whose two edges, at least approximately perpendicularly to the direction of the series of contact pads, have a length less than the distance separating the two series of contact pads; this makes it possible to position the ends of the outermost teeth between the contact pads, and thus reduce the surface covered by the coating mass while allowing a reduction in the length of the connection wires.

In particularly advantageous manner, the holes are connected, on the inner surface of the supporting film, to metallized tracks parallel and/or perpendicular to the direction of the series of pads, passing between the opposite ends of the outermost teeth of two distinct combs, in middle zones substantially located midway from the edges of the supporting film, which are bordered by the series of electrical contact pads. Thus, these tracks contribute, along with the ends and the holes, to delimiting the central zone surrounding the microcircuit while allowing the ends to enclose this central zone perpendicularly to the direction of the series of contact pads. These tracks are advantageously formed by strands which are parallel, or perpendicular, to this direction.

According to another advantageous characteristic of the invention, the metallized tracks connected to the holes have a curved shape, on the outside of the resin mass coating the microcircuit and the connection wires; this adds to the mechanical strength of the module.

According to yet another advantageous characteristic of the invention, the ends of the teeth of the two combs jointly delimit a polygonal central zone surrounding the microcircuit, on the outside of which are situated the holes, which helps reduce the coating mass needed to cover the holes and the ends of the teeth of the two combs in the given direction. The result is a greater available width in the given direction for the adhesive, thus ensuring a good adhesion of the microcircuit to the supporting film and of the coating mass to this supporting film.

According to another advantageous characteristic of the invention, the outermost teeth have ends with indentations toward the central zone, which helps reduce the surface of the supporting film that needs to be covered by the resin mass.

According to yet another advantageous characteristic of the invention, the ends of the teeth are at the same distance from the ends of the closest teeth, to within 20%. This helps facilitate the choice, for any given format of microcircuit, of the tooth end of a comb to which an appropriate terminal of this microcircuit should be connected, by means of a reasonably short wire.

According to yet another advantageous characteristic of the invention, the module comprises two combs provided with four teeth jointly delimiting an octagonal central zone. It is preferably regular, which helps facilitate the choice, for any given format of microcircuit, of the tooth end of a comb to which an appropriate terminal of this microcircuit should be connected, by means of a reasonably short wire.

According to yet another advantageous characteristic of the invention, between the two series of three contact pads (C1-C3, C5-C7) there are two transverse contact pads (C4, C8) respectively situated between the first contact pads of the two series and between the third contact pads of the two series, at a distance from a central zone situated next to the microcircuit and the coating resin mass, which allows the most complete possible use of the various connection terminals of the microcircuit.

According to yet another advantageous characteristic of the invention, the outer surface furthermore has a central pad (C5A) electrically connected to one of the pads of one of the series of contact pads and separated from the two transverse contact pads by slots along the periphery of the resin mass coating the microcircuit on the other surface. This helps rigidify the supporting film next to the location where the microcircuit is mounted.

According to yet another advantageous characteristic of the invention, the slots along the transverse contact pads have their concavity turned toward the central zone and the periphery of said resin mass likewise has its concavity turned toward the microcircuit. This allows an at least approximate superpositioning of the periphery of said mass and the slots.

According to another advantageous characteristic of the invention, the holes are connected, on the inner surface, to metallized tracks having, on the outside of the resin mass, a curvature equal to that of elementary portions forming slots along the series of contact pads and a central metallized pad. This adds to the mechanical strength of the module.

According to yet another advantageous characteristic of the invention, there are at least 5 holes.

According to yet another advantageous characteristic of the invention, the dimensions of the module are at most those of the format M3, that is, 11+/−0.2 mm*8.2+/−0.2 mm.

According to another aspect of the invention, it proposes a supporting film intended for the fabrication of modules of the aforementioned type.

For this purpose, it proposes a supporting film intended for the fabrication of a module of the aforementioned type, supporting on an outer surface a plurality of electrical contact pads (C1-C8) and, on an inner surface, internal connection zones and a location designed to receive a microcircuit comprising direction terminals needing to be connected to pads of the supporting film by wires, this supporting film being traversed by holes situated at a distance from the location designed for the microcircuit, this inner surface being adapted to be covered, together with the microcircuit, by a mass of coating resin extending as far as a given line, characterized in that the contact pads of the outer surface comprise two series of only three pads (C1-C3, C5-C7), extending in a given direction, and in that the internal connection zones are shaped as two combs whose two bodies extend respectively under each of the two series of contact pads, each body extending under each of the pads of the corresponding series at a distance from the zone which is to be covered by the coating mass, these combs having teeth which extend from their body, transversely to the given direction, as far as the ends emerging in the zone intended to be covered by the coating mass.

According to yet another aspect of the invention, it proposes a dual card comprising a module of the aforementioned type.

It thus proposes a dual microcircuit comprising a card body in which is situated an antenna and a cavity comprising a deep portion surrounded by a course of lesser depth, as well as a module of the aforementioned type, the antenna having ends situated on the course surrounding the deep portion of the cavity, on sides perpendicular to the direction in which the card is intended to be inserted into a contact type reading terminal, the microcircuit and its mass of coating resin being situated in the deep portion of the cavity, and the module being secured to the card body by a mass of resin connecting the periphery of the module all along the course, the internal connection zones being next to the ends of the antenna, and the resin being anisotropically electrically conductive perpendicular to the plane of the supporting film.

A chip card according to the invention advantageously has the characteristics mentioned above with regard to the module taken in isolation. In particularly advantageous manner, the space between the mass of coating resin of the microcircuit and the mass of anisotropic attachment resin is next to slots delimiting the transverse contact pads of the module (C4, C8), between the first pads and the third pads of said series of contact pads, and a central pad next to the entire microcircuit.

Figure 2:
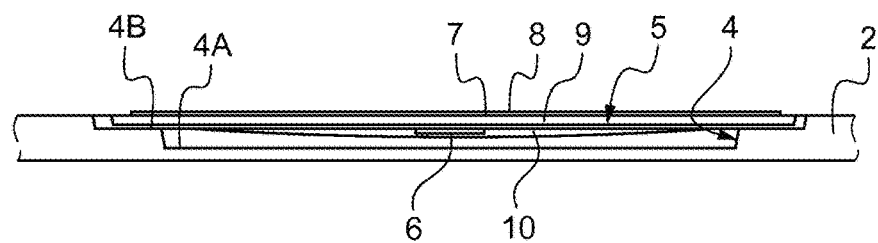
Figure 3:
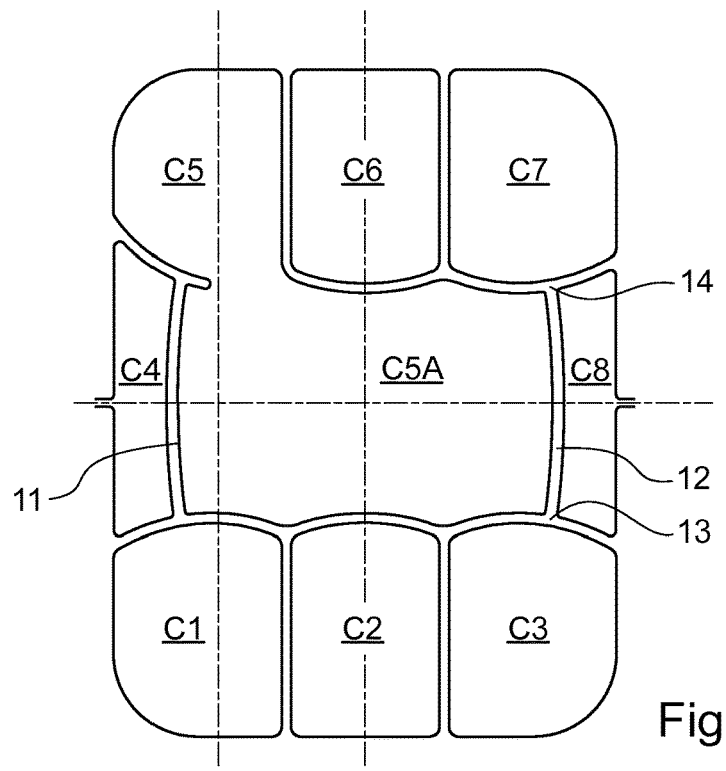
Figure 4:
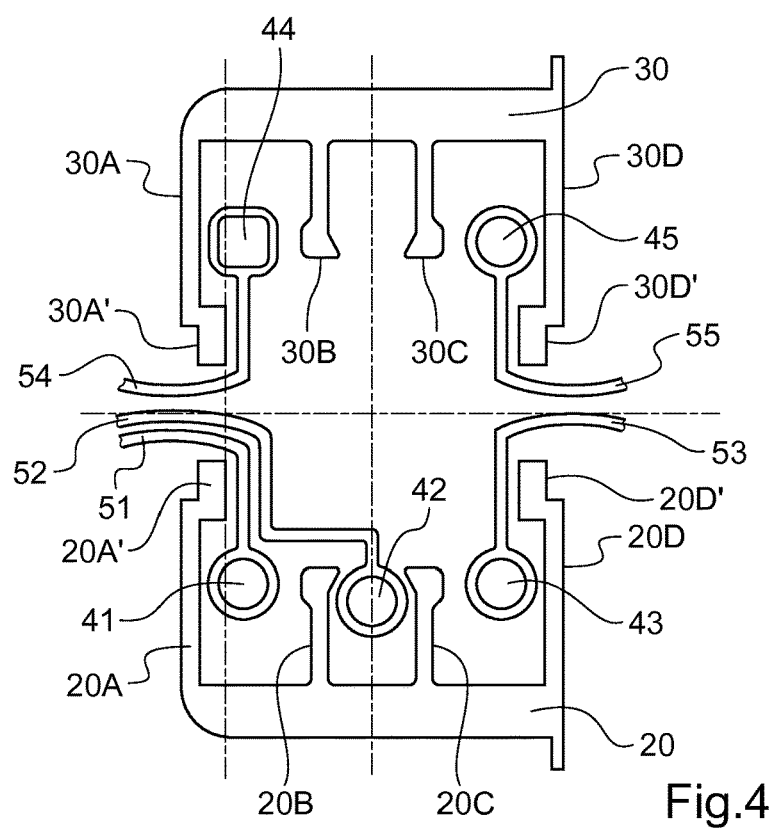
Figure 5:
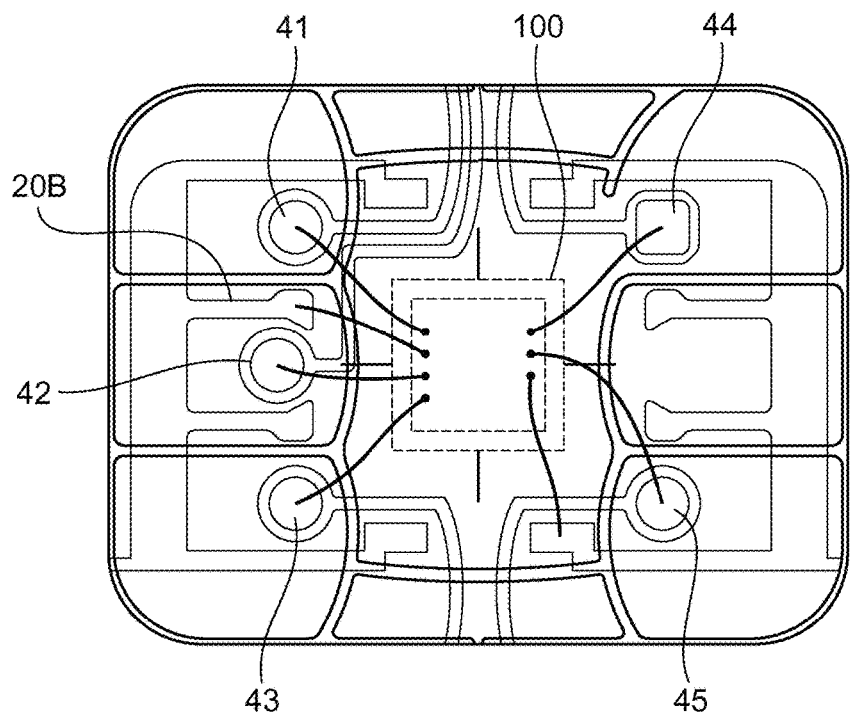
Figure 6:
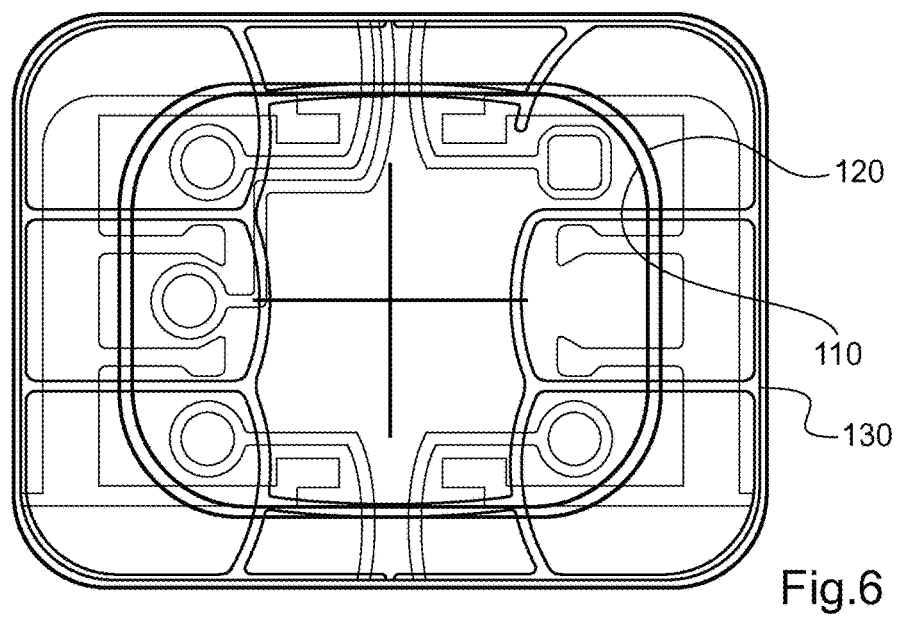

Purposes, characteristics, and advantages of the invention will emerge from the following description, given as an illustrative example without limitation, in consideration of the enclosed drawings, in which:

FIG. 1 is a schematic exploded view of a chip card whose microcircuit is part of a module according to the invention, mounted in a cavity of the card body, FIG. 2 is a partial cross section along line II-II of FIG. 1 showing the supporting film of the module and its microcircuit in the cavity of the body, FIG. 3 represents the drawing of a plurality of contact pads supported by the outer surface of the supporting film of the module, FIG. 4 represents the drawing of a printed circuit supported by the inner surface of the supporting film of the module, FIG. 5 is a view showing, in see-through manner through the supporting film, the superpositioning of the pads of FIG. 3 and the printed circuit of FIG. 4, FIG. 6 is a view showing, in see-through manner through the supporting film, not only the superpositioning of the zones of FIGS. 3 and 4, but also zones of resin with which the module cooperates when it is mounted in the cavity of a card body.

FIG. 1 shows, in schematic manner and in exploded view, a chip card 1, such as one in format ID-1 or 1FF (credit card) having a body 2 in which an antenna 3 has been formed and having a cavity 4 in which is lodged a module 5 comprising a microcircuit 6.

The cavity comprises a central portion 4A bordered along its periphery by a course 4B of lesser depth than that of the central portion. The antenna 3 has any given number of turns, and two broadened ends 3A and 3B situated on the course 4B. The body is made of one or more appropriate plastic materials, in known manner.

It is seen in FIG. 1 that, in the example shown, the ends are situated along sides of the cavity which are perpendicular to the direction F in which the card is meant to be inserted into a contact type communication reader (not shown).

The module 5 comprises a supporting film 7 whose one face, the outer surface (here, the upper surface, intended to be oriented toward the outside of the card), carries a plurality of metallic contact pads denoted jointly by reference 8 (its exact configuration is only represented further below, particularly in FIG. 3) and whose other face, the inner surface (here the lower surface, intended to be oriented toward the bottom of the cavity) carries a printed circuit denoted overall by reference 9, as well as the microcircuit 6 (which is thus shown in FIG. 1 in see-through manner through the supporting film).

This microcircuit is mounted such that its connection terminals are facing the bottom of the cavity (opposite the supporting film), so as to allow a connection by wire (or wiring); thus, it is not a microcircuit mounted upside down (known as a "flip-chip", where the terminals are next to the inner surface of the support film).

One advantage of such a mounting by wire is that the geometry of the printed circuit can be defined independently of the microcircuit with which it is ultimately associated; yet this has the consequence that the zones at which the connection wires secured to the connection terminals of the microcircuit need to be away from the zone covered by the microcircuit (these wires are not shown in these FIGS. 1 and 2). As regards the connection of certain of the terminals of the microcircuit to contact pads located on the outer surface, this is done by means of holes (not represented in these FIGS. 1 and 2), that is, holes passing through the thickness of the supporting film. The wires are connected to the bottom of the hole.

In the case when the inner wall of the holes is electrically connected to said contact pads, the connection wires may be simply soldered to the inside of these holes.

In classical fashion, the microcircuit and the connection wires are embedded in a mass of rigid resin 10, whose rigidity guarantees a protection of the microcircuit against certain mechanical forces, while being compatible with a destruction of the microcircuit in event of an attempt to remove the microcircuit from the supporting film.

The attachment of the module to the inside of the cavity (not shown) is done by means of a resin, or an adhesive, which is electrically conductive (in practice, anisotropic) and covers the course 4B and/or by another resin interposed between the protection resin 10 and the bottom of the cavity.

FIG. 3 shows the outer surface of the module, with various contact pads, customarily arranged in two series of at least three pads, denoted here C1 to C3, C5 to C7, in accordance with standardized notation (these pads thus cover the minimal zones as defined by these standards); one pad, here the pad C5, is prolonged toward the center in a zone C5A; the presence of another two pads denoted C4 and C8 which may not have any role, in accordance with the standards is noted. These pads, being disposed across the space separating the two series of contact pads, are known as transverse contact pads.

The contact pads are separated here from each other by etching lines or slots devoid of metal on the support film.

Two slots 11 and 12 are disposed between the central portion C5A, on the one hand, and each of the zones C4 and C8. These slots extend here from the slot 13 which separates this central portion C5A from the pads C1 to C3, on the one hand, to the slot 14 which separates this central portion from the pads C5 to C7 (this slot is represented here as being discontinuous to allow a continuity between the pad C5 and the central portion C5A; the portion separating the pads C5 and C4 is prolonged for a short distance inside the connection between the pad C5 and the central portion C5A, which constitutes an incipient break, if need be, in the location where the annular slot (loop) formed jointly by the slots 11 to 14 is interrupted). According to one variant not represented, the pads C5 and C5a are separated.

The aforementioned holes do not pass through these contact pads; these holes are in fact blocked by the contact pads next to which they are situated.

It may be noted that the pad C5A defines, for the supporting film, a central zone whose rigidity is homogeneous. It is advantageously next to the entire microcircuit and at least a portion of the coating mass.

FIG. 4 shows the inner surface of the module, more precisely the inner surface of the supporting film.

The printed circuit denoted in FIG. 2 by the general reference 9 comprises two broad contact zones 20 and 30 intended to make contact with the end zones 3A and 3B of the antenna; these broad zones each have a general comb shape, here, one of four teeth; in a variant, not represented, it may only have two teeth, or three; in fact, the number of teeth helps increase the ease of making a connection between these zones 20 and 30 with the corresponding terminals of a large variety of microcircuit geometries. These combs have bodies (that is, portions from which the teeth extend) which extend in parallel with the series of contact pads, the comb body 20 extending under each of the pads C1 to C3 and the comb body 30 extending under each of the pads C5 to C7. These comb bodies are situated in immediate proximity to the edges of the supporting film which are parallel to the series of contact pads (they are intended not to be covered by the coating mass and to be next to the edge of the cavity).

These combs have at least two outermost teeth starting at the ends of their respective bodies and preferably at least one intermediate tooth; each of the teeth extends, starting from the body, independently of the others, transversely to the direction of the series of contact pads (at least approximately perpendicular to this direction, for example, to within 10°).

These combs are here symmetrical to each other with respect to a horizontal line in FIG. 4. As a variant, not represented, these combs may have different numbers of teeth (such as 4 for the comb 20 and 3 for the comb 30; in fact, as will appear from the following, the number of teeth may depend on the number of holes.

In advantageous manner, the outermost teeth, 20A and 20D on the one hand, and 30A and 30D on the other hand, are longer than the intermediate teeth 20B and 20C, 30B and 30C; moreover, the ends of these outermost teeth preferably have indentations 20A', 20D', 30A' and 30D' toward the center of the inner surface of the supporting film. The ends of the teeth are locally broadened here.

The printed circuit 9 of FIG. 4 furthermore comprises here annular zones, or collars, surrounding the holes needed for the connection of the connection terminals of the microcircuit to the appropriate pads of the outer surface. These collars prevent the deposition of residue or dust on the margin of the hole.

There are 5 of these holes here, namely, three holes 41, 42 and 43 between the four teeth of the comb 20 and two holes 44 and 45 between the teeth 30A and 30B, and the teeth 30C and 30D of the comb 30.

These annular zones, whose surface may be as small as could be desired, are joined here to conductive tracks, denoted 51 to 55. In operation, these tracks have no particular role, since their principal function is to bring current to the location of the holes in order to ensure a good metallization of the annular zones and possibly their internal wall during the fabrication of the supporting film. However, as will be discussed further below, these tracks are in practice preserved because of the role of rigidification, or on the contrary the role of guidance in deformation, which they may play.

The holes are represented as having a circular cross section (holes 41-43 and 45) or square cross section with rounded corners (hole 44); the annular zones which surround them have in practice the same circular or square shape. However, it will be understood that the holes may have any given cross section.

The teeth of the combs 20 and 30 as well as the holes leave in place a central non-metallized zone, next to the zone C5A of the outer surface, intended to receive the microcircuit 6. As indicated above, the geometry of the printed circuit 9 can be adapted to a great variety of microcircuits, which means that the production of the supporting film with the metallization of its inner and outer surfaces may be effectuated in a single manner, regardless of the nature of the microcircuit which will ultimately be specified for them; it will be understood that this helps hold down the cost of the supporting film.

More precisely, it may be noted that the outermost teeth define, by their ends, a polygon, more precisely an octagon in the example represented, since there are two combs of four teeth each. This polygon advantageously has sides which are at least approximately equal (for example, to within 20%). It may be noted that the holes here are outside this polygon. In fact, most of the surface of this polygon is available for the placement of the microcircuit, with the exception of the metallized tracks which preferably border the periphery of this polygon (more precisely, the tracks are formed here by strands, either parallel or perpendicular to the direction of the series of contact pads. It may likewise be noted that, in the example represented, the distance between the ends of outermost teeth next to the combs, for example, the distance between the ends 20A' and 30A', is at most equal to the length of the intermediate teeth.

Indeed, the ends of the outermost teeth define narrow passages for the metallized tracks to leave the aforesaid polygon; more precisely, the tracks leave this polygon in middle zones, substantially equidistant from the comb bodies, while having a curved shape.

FIG. 5 represents the module in a top view, showing however in see-through manner through the supporting film what is located beneath this supporting film.

It is also observed that the comb 20 is situated beneath the pads C1 to C3, whereas the comb 30 is situated beneath the pads C5 to C7. Moreover, the holes 41 to 43 are respectively situated under the pads C1 to C3, while the holes 44 and 45 are respectively situated under the pads C5 and C7. The ends of the outermost teeth are sufficiently elongated so that their ends are not next to the pads beneath which their respective bodies extend; more precisely, these ends are situated here between these series, underneath the central zone, which is favorable to the mechanical strength of the module.

A box in broken lines 100 represents the available space for installing a microcircuit and, inside this imaginary box, a box in dashes delimits an example of a microcircuit. It may be noted that, on this microcircuit, there are 4 terminals at left and 3 terminals at right; the four terminals at left are respectively connected to the holes 41 to 43 and to the tooth 20B of the comb 20, while the three terminals at right are respectively connected to the holes 44 and 45 and to the tooth 30D of the comb 30. It is easily understood that, with a microcircuit whose connection terminals have a different configuration, it might be appropriate to connect terminals to any one of the teeth of the comb 20 and to any one of the teeth of the comb 30.

It may be noted that the microcircuit, once inside the virtual box 100, is situated next to a rigidified zone of the supporting film (by reason of the zone C5A) which is moreover rigidified by power supply lines 51 to 55 whose presence tends to rigidify the central zone like a frame which rigidifies a painting.

FIG. 6 shows, by analogy with FIG. 5, the module in a top view, but showing in see-through fashion through the supporting film what is located beneath this supporting film.

It is thus observed, as in FIG. 5, that the comb 20 is situated beneath the pads C1 to C3, whereas the comb 30 is situated beneath the pads C5 to C7. Moreover, the holes 41 to 43 are respectively situated under the pads C1 to C3, while the holes 44 and 45 are respectively situated under the pads C5 and C7.

Unlike FIG. 5, FIG. 6 does not visualize a microcircuit; however, a curved line 110 bordered by a curved line 120 is observed, and then near the edge of the supporting film another curved line 130.

The line 110 represents the periphery of the mass of coating resin of the microcircuit. It encompasses a major portion of the total surface of the supporting film; in particular, it surrounds not only the central zone receiving the microcircuit (not shown), but also the holes 41 to 45 and the ends of the teeth of the combs 20 and 30. Thus, this line 110 necessarily coats the connection wires between the connection terminals of the microcircuit and the combs, as well as the holes. On the other hand, this line 110 does not encompass the bodies of the combs 20 and 30; in the example represented, neither does it encompass the beginning of the teeth (preferably, it does not cover more than 75% of the length of the teeth).

It should be noted that, in order to allow a good connection of the microcircuit to the holes and to the teeth of the comb, these holes and these ends should be situated away from the zone receiving the microcircuit (line 100), yet inside the line 110. The fact that the outermost teeth of the combs are longer than the intermediate teeth has the advantage that there are ends of teeth next to each of the sides of the microcircuit; and the fact that the ends of the outermost teeth have an indentation toward the central zone helps guarantee that, even with significant tolerances in regard to the line 110 by the mass of coating resin effectively deposited, these ends are sure to be covered by this mass.

It may be noted that the mass of coating resin extends over a rectangular zone (with rounded corners) slightly larger than the polygon defined by the group of holes.

Unlike what is shown in FIG. 2, the mass of has an approximately parallelepiped shape.*

It may be noted that the microcircuit covers a portion entirely devoid of metal of the supporting film, which helps ensure a good fixation of the microcircuit, on the one hand because of the planarity of this covered portion, and on the other hand because the adhesion to the supporting film is better than the adhesion to the conductive metal, which is in practice copper.

The line 120 defines the inner edge of the course 4B surrounding the deep central portion of the cavity, while the line 130 delimits its outer edge; the zone situated between the lines 120 and 130 thus corresponds to the resin bonded zone for the fixation of the module to the course of the cavity.

It may be noted that the space between the lines 110 and 120 thus delimits the space between the mass of coating resin and the mass of resin for attachment to the course 4B. This space represents only a very slight fraction of the surface of the module, typically less than 10%, or even less than 5%. This means that the module is rigidified by the combination of the two resin masses over nearly its entire surface.

However, according to one interesting characteristic of the invention, the band delimited between the lines 110 and 120 is advantageously superimposed with the slots 11 and 12 delimiting the pads C4 and C8, respectively, from the central zone C5A. This superpositioning is facilitated when, as is represented as an example, the slots 11 and 12 are convex. The result, in combination with the aforementioned rigidification, is a bending capacity in these locations which are perpendicular to the series of contact pads C1-C3, C5-C7; it is especially interesting to note that this bending capacity is located next to the space situated between the mass of coating resin and the wall of the central zone of the cavity. This zone of flexibility of the module as such is thus situated at the location of a zone of flexibility of the card provided with this module.

Different variants fall within the scope of the invention, especially the fact that the number of holes through the supporting film, being 5 here, may be fewer (such as 4).

It should be noted that, despite the small size of the supporting film, the microcircuit is effectively coated, as are the wires for connection to the combs and to the holes (the degree of filling of the cavity by the coating resin is significant), while leaving a significant surface for the attachment to the course bordering the cavity, and while observing a significant degree of flexibility. A good adhesion between the module and the card body is obtained. These advantages are strengthened by the fact that the outermost teeth have ends with indentations toward the central zone. The ends are thus disposed in the central zone leaving a significant surface for the attachment of the edges perpendicular to the series of contact pads.

Such a configuration has been found to obey the standardized bending and torsion tests.

In fact, the presence of the central zone C5A promotes the rigidification of the central portion of the module, yet it will be understood that the coating resin already in itself provides a significant degree of rigidity for the module, especially in its central portion.

As for the nearly continuous slot formed by the slots 11 to 14, this has the advantage of allowing a flexure/torsion at a distance from the microcircuit, compatible with a return to the planar configuration after stresses.

These slots furthermore enable a relaxation of stresses in various possible directions.

The fact that the slots 13 and 14 separating the series of pads C1-C3 and C5-C7 from the central zone are formed of elementary slots having the same curvature as the power supply tracks 51 to 54 which are parallel to these slots 13 and 14 has the advantage of producing lines of attack of the same radius, which facilitates the fabrication. As for the existence of the power supply lines themselves, their orientation approximately parallel to the slots 13 and 14 has the advantage of defining lines of weakness or rigidity which are parallel, which is favorable to a guiding of deformations along these lines. In particular, the power supply lines ensure a guidance of any relaxation of stresses within the zone of attachment of the module to the course bordering the cavity.

The fact that these elementary slots have their concavity turned toward the outside of the module whereas the slots 11 and 12 have their concavity turned toward the center of the module has the advantage of reducing the risk of a breakage in these locations, which are not rectilinear.

In the example represented, the module is in format M3.

The invention claimed is:

1. A dual module for a dual chip card, comprising a supporting film (7) supporting on an outer surface a plurality of electrical contact pads (C1-C8) including two series of electrical contact pads extending in a given direction for their entire length along two edges of this supporting film which are parallel to this direction and, on an inner surface, two internal connection zones (9) designed to be connected to an antenna of said dual chip card and a microcircuit (6), this microcircuit having connection terminals connected by wires respectively to the internal connection zones or to certain of the electrical contact pads by means of holes (41-45) passing through this supporting film while being coated, together with these wires, by a coating resin mass, wherein the series of electrical contact pads of the outer surface have only three pads (C1-C3, C5-C7) and wherein each of the two internal connection zones is shaped as a comb (20, 30) comprising a body extending under each of the pads of one of the two series of contact pads separated from the coating mass, and teeth, including two end teeth starting at the ends of the body and at least one intermediate tooth (20A-D, 30A-D), which extend independently of one another from said body, transversely to the given direction, as far as the ends covered by the coating mass, one of the ends of one tooth of each comb being connected by one of said wires to one of said connection terminals of the microcircuit.

2. The dual module as claimed in claim 1, whose teeth of the combs extend from their body on either side of the holes, the outermost teeth of each comb, which are the ones furthest apart from each other, being longer than the other teeth of the same comb, so that their ends are next to a zone of the outer surface which is situated between said series of electrical contact pads.

3. The dual module as claimed in claim 2, whose holes are connected, on the inner surface of the supporting film, to metallized tracks parallel and/or perpendicular to the direction of the series of pads, passing between the opposite ends of the outermost teeth of two distinct combs, in middle zones substantially located midway from the edges of the supporting film, which are bordered by the series of electrical contact pads.

4. The dual module as claimed in claim 3, whose metallized tracks connected to the holes have a curved shape, on the outside of the resin mass coating the microcircuit and the connection wires.

5. The dual module as claimed in claim 4, whose ends of the teeth of the two combs jointly delimit a polygonal central zone surrounding the microcircuit, on the outside of which are situated the holes.

6. The dual module as claimed in claim 3, whose ends of the teeth of the two combs jointly delimit a polygonal central zone surrounding the microcircuit, on the outside of which are situated the holes.

7. The dual module as claimed in claim 3, whose outermost teeth have ends with indentations toward the central zone.

8. The dual module as claimed in claim 2, whose ends of the teeth of the two combs jointly delimit a polygonal central zone surrounding the microcircuit, on the outside of which are situated the holes.

9. The dual module as claimed in claim 2, whose outermost teeth have ends with indentations toward the central zone.

10. The dual module as claimed in claim 2, the ends of whose teeth are at the same distance from the ends of the closest teeth, to within 20%.

11. The module as claimed in claim 2, comprising two combs provided with four teeth jointly delimiting an octagonal central zone.

12. The dual module as claimed in claim 1, comprising, between the two series of three contact pads (C1-C3, C5-C7), two transverse contact pads (C4, C8) respectively situated between the first contact pads of the two series and between the third contact pads of the two series, at a distance from a central zone situated next to the microcircuit and the coating resin mass.

13. The dual module as claimed in claim 12, whose outer surface furthermore has a central pad (C5A) electrically connected to one of the pads of one of the series of contact pads and separated from the two transverse contact pads by slots (11, 12) along the periphery of the resin mass coating the microcircuit on the other surface.

14. The dual module as claimed in claim 13, whose slots along the transverse contact pads have their concavity turned toward the central zone and whose periphery of said resin mass likewise has its concavity turned toward the microcircuit.

15. The dual module as claimed in claim 1, whose holes are connected, on the inner surface, to metallized tracks having, on the outside of the resin mass, a curvature equal to that of elementary portions forming slots (13, 14) along the series of contact pads and a central metallized pad.

16. The dual module as claimed in claim 1, having at least 5 holes.

17. The dual module as claimed in claim 1, whose dimensions are at most those of the format M3, that is, 11+/−0.2 mm*8.2+/−0.2 mm.

18. A supporting film intended for the fabrication of a module as claimed in claim 1, supporting on an outer surface a plurality of electrical contact pads (C1-C8) and, on an inner surface, internal connection zones (9) and a location (100) designed to receive a microcircuit comprising direction terminals needing to be connected to pads of the supporting film by wires, this supporting film being traversed by holes (41-45) situated at a distance from the location designed for the microcircuit, this inner surface being adapted to be covered, together with the microcircuit, by a mass of coating resin extending as far as a given line (110), wherein the contact pads of the outer surface comprise two series of only three pads (C1-C3, C5-C7), extending in a given direction, and wherein the internal connection zones are shaped as two combs (20, 30) whose two bodies extend respectively under each of the two series of contact pads, each body extending under each of the pads of the corresponding series at a distance from the zone which is to be covered by the coating mass, these combs having teeth (20A-D, 30A-D) which extend from their body, transversely to the given direction, as far as the ends emerging in the zone intended to be covered by the coating mass.

19. A dual chip card comprising a card body in which is situated an antenna (6) and a cavity comprising a deep portion surrounded by a course (4B) of lesser depth, as well as a module as claimed in claim 1, the antenna having ends (3A, 3B) situated on the course surrounding the deep portion of the cavity, on sides perpendicular to the direction (F) in which the card is intended to be inserted into a card reading terminal, the microcircuit and its mass of coating resin being situated in the deep portion of the cavity, and the module being secured to the card body by a mass of resin connecting the periphery of the module all along the course, the internal connection zones being next to the ends of the antenna, and the resin being anisotropically electrically conductive perpendicular to the plane of the supporting film.

20. The dual card as claimed in claim 19, wherein the space between the mass of coating resin of the microcircuit and the mass of anisotropic attachment resin is next to slots (11, 12) delimiting transverse contact pads of the module (C4, C8), between the first pads and the third pads of said series of contact pads, and a central pad (C5A) next to the entire microcircuit.

* * * * *